(12) United States Patent
Yoshikawa et al.

(10) Patent No.: US 10,896,842 B2
(45) Date of Patent: Jan. 19, 2021

(54) MANUFACTURING METHOD OF SAMPLE TABLE

(71) Applicant: TOKYO ELECTRON LIMITED, Tokyo (JP)

(72) Inventors: Wataru Yoshikawa, Amagasaki (JP); Kazuki Moyama, Amagasaki (JP); Nobuyuki Okayama, Amagasaki (JP); Kenji Sudou, Amagasaki (JP); Yasuhiro Otsuka, Amagasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 284 days.

(21) Appl. No.: 15/966,506

(22) Filed: Apr. 30, 2018

(65) Prior Publication Data

US 2018/0286740 A1 Oct. 4, 2018

Related U.S. Application Data

(63) Continuation-in-part of application No. 13/502,829, filed as application No. PCT/JP2010/066910 on Sep. 29, 2010, now abandoned.

(30) Foreign Application Priority Data

Oct. 20, 2009 (JP) ................. 2009-241538

(51) Int. Cl.
*H01L 21/687* (2006.01)
*C04B 37/02* (2006.01)
(Continued)

(52) U.S. Cl.
CPC .......... *H01L 21/6875* (2013.01); *C04B 37/02* (2013.01); *H01L 21/67103* (2013.01);
(Continued)

(58) Field of Classification Search
CPC ............ H01L 21/6831; H01L 21/6833; H01L 21/6875; H01L 21/68735; H01J 37/32715; H01J 37/32724
See application file for complete search history.

(56) References Cited

U.S. PATENT DOCUMENTS 5,761,023 A 6/1998 Lue et al.
5,886,863 A 3/1999 Nagasaki et al.
(Continued)

FOREIGN PATENT DOCUMENTS

JP 2002134591 5/2002
JP 2002154179 5/2002
(Continued)

OTHER PUBLICATIONS

International Search Report—PCT/JP2010/066910 dated Dec. 28, 2010.

*Primary Examiner* — Christopher J Besler
(74) *Attorney, Agent, or Firm* — Cantor Colburn LLP

(57) ABSTRACT

A manufacturing method of sample table is provided. The sample table holds a semiconductor wafer on which a plasma process is to be performed, and the manufacturing method includes: preparing an adsorption plate that has a contact surface on which a lapping process has been performed and surface-contacting the semiconductor wafer, and that adsorbs the semiconductor wafer; and preparing a supporting substrate which has a recess surface to which a noncontact surface of the adsorption plate is adhered, wherein a difference between a depth of an approximate center portion of the recess surface and a depth of a distant portion spaced apart from the approximate center portion is larger than a difference between a thickness of the adsorption plate at a portion contacting the approximate center
(Continued)

portion and a thickness of the adsorption plate at a portion contacting the distant portion.

9 Claims, 11 Drawing Sheets

(51) Int. Cl.
*H01L 21/67* (2006.01)
*B23P 19/04* (2006.01)
*F16B 11/00* (2006.01)

(52) U.S. Cl.
CPC .. *H01L 21/67109* (2013.01); *H01L 21/68735* (2013.01); *B23P 19/04* (2013.01); *C04B 2237/402* (2013.01); *F16B 11/006* (2013.01)

(56) References Cited

U.S. PATENT DOCUMENTS

| | | | |
|---|---|---|---|
| 6,228,438 B1 | 5/2001 | Schmitt | |
| 6,876,534 B2 | 4/2005 | Tossell | |
| 7,619,870 B2 | 11/2009 | Himori et al. | |
| 8,284,538 B2 | 10/2012 | Himori et al. | |
| 8,390,980 B2 * | 3/2013 | Sansoni | H01L 21/6833 361/234 |
| 2003/0070616 A1 | 4/2003 | Shang et al. | |
| 2006/0021705 A1 | 2/2006 | Imai et al. | |
| 2007/0076346 A1 | 4/2007 | Dhindsa et al. | |
| 2007/0144442 A1 | 6/2007 | Migita | |
| 2008/0037195 A1 | 2/2008 | Himori et al. | |
| 2008/0041312 A1 | 2/2008 | Matsuyama et al. | |
| 2008/0062611 A1 | 3/2008 | Himori et al. | |
| 2009/0101284 A1 | 4/2009 | Higuma et al. | |

FOREIGN PATENT DOCUMENTS

| | | | |
|---|---|---|---|
| JP | 2003133401 | | 5/2003 |
| JP | 2004040047 | | 2/2004 |
| JP | 2004052098 | | 2/2004 |
| JP | 2004273619 | | 9/2004 |
| JP | 2006013302 | | 1/2006 |
| JP | 2008042138 | | 2/2008 |
| JP | 2008243973 A * | 10/2008 | ........ H01J 37/32532 |
| JP | 2009510774 | | 3/2009 |

* cited by examiner

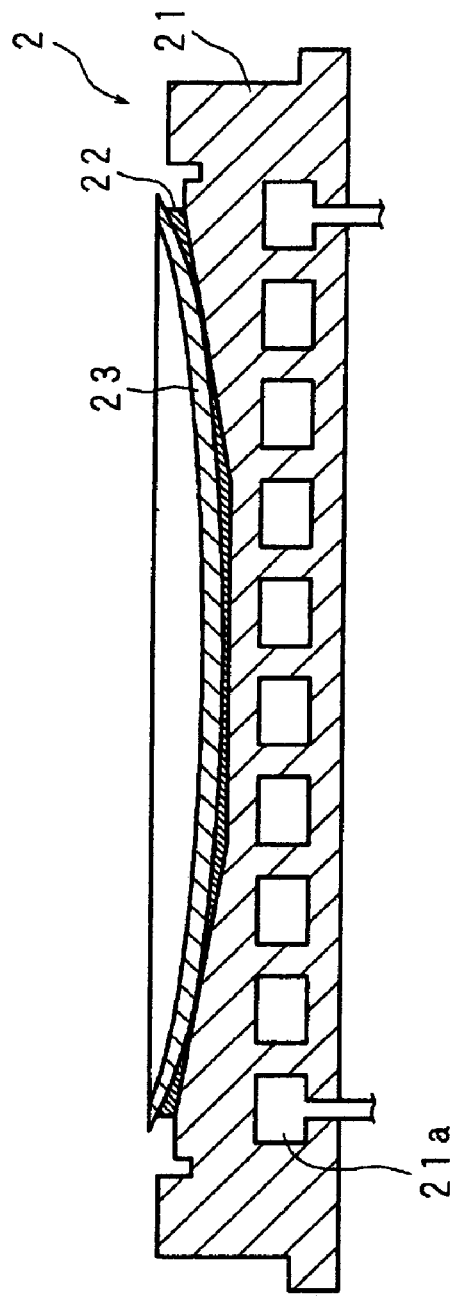

MANUFACTURING METHOD OF SAMPLE TABLE

TECHNICAL FIELD

The present invention relates to a manufacturing method of sample table that holds a substrate to be processed and is included in a microwave plasma processing apparatus that generates plasma in a processing chamber by using microwaves to perform a plasma process on a substrate by using the plasma.

BACKGROUND ART

A semiconductor manufacturing apparatus includes a sample table that adsorbs and holds a substrate, for example, a semiconductor wafer, on which a plasma process is to be performed. The sample table includes an adsorption plate formed of ceramic, which electrostatically holds the semiconductor wafer, and an electrode for electrostatic adsorption, a heater for heating, etc. are buried in the adsorption plate. In order to uniformly process the semiconductor wafer, a temperature distribution of the semiconductor wafer may be made uniform. Accordingly, a contact surface of the adsorption plate contacting the semiconductor wafer may be smoothened by a lapping process such that heat resistance between the contact surface and the semiconductor wafer is uniform.

Meanwhile, Patent Document 1 discloses a sample table that has a recess portion on a substrate holding surface for supporting a semiconductor wafer so as to form a predetermined space between the semiconductor wafer and the substrate holding surface. Since a temperature is easily increased at a center portion of the semiconductor wafer, the sample table is formed such that a depth at a center portion of the recess portion is largest, and is decreased from the center to an end, thereby making uniform a temperature distribution of the semiconductor wafer.

Patent Document 2 discloses a sample table, where a recess portion having a depth of 3 to 10 μm is formed on one main surface of a plate-shaped ceramic body except an outer circumferential portion of the main surface, undulations of a top surface of the outer circumferential portion are set to 1 to 3 μm, a gas groove is provided to a peripheral portion of a bottom surface of the recess portion, and an electrode for electrostatic adsorption is arranged within the plate-shaped ceramic body beneath the bottom surface of the recess portion.

[Patent Document 1] Japanese Laid-Open Patent Publication No. 2004-52098

[Patent Document 2] Japanese Laid-Open Patent Publication No. 2003-133401

DISCLOSURE OF THE INVENTION

Technical Problem

FIGS. 10A and 10B are diagrams for describing problems of a conventional sample table. FIG. 10A schematically shows a conventional sample table 102 on which a semiconductor wafer W is held. FIG. 10B shows a measurement result of a temperature distribution in the semiconductor wafer W held on the conventional sample table 102, under a plasma environment. When a lapping process is performed to smooth a contact surface of an adsorption plate provided to a sample table, the contact surface has a curved shape where an approximate center portion has a convex shape as shown in FIG. 10A. Accordingly, the semiconductor wafer W horizontally held on the adsorption plate is unstable due to a single-point support as shown in the left of FIG. 10A, and is easily tilted to one side as shown in the right of the FIG. 10A. Thus a large gap is generated between the semiconductor wafer W and the adsorption plate on the other side. As a result, as shown in FIG. 10B, heat resistance at a location with a large gap is locally increased and a heating value is decreased at the location, and thus the semiconductor wafer W has a local high temperature portion. According to an experiment, a temperature difference ΔT on the semiconductor wafer W was about 15° C.

The above problems are commonly generated not only when the lapping process is performed on the contact surface of the adsorption plate, but also when the approximate center portion is curved to the convex shape after a predetermined surface process.

Also, since the sample table disclosed in Patent Document 1 does not surface-contact the semiconductor wafer, it is difficult to highly precisely control a temperature of the semiconductor wafer.

In addition, Patent Document 2 does not disclose a means for resolving the above problems.

Technical Solution

The present invention provides a sample table that stably holds a substrate by forming a contact surface of an adsorption plate to have an approximate recess shape even when a predetermined surface process, for example, a lapping process, is performed on the contact surface, and a microwave plasma processing apparatus including the sample table.

According to an aspect of the present invention, there is provided a manufacturing method of sample table which holds a substrate to be processed, the manufacturing method including: preparing an adsorption plate which has a contact surface surface-contacting the substrate, and adsorbs the substrate; and preparing a supporting substrate which has a recess surface to which a noncontact surface of the adsorption plate is adhered, wherein a difference between a depth of an approximate center portion of the recess surface and a depth of a distant portion spaced apart from the approximate center portion is larger than a difference between a thickness of the adsorption plate at a portion contacting the approximate center portion and a thickness of the adsorption plate at a portion contacting the distant portion.

According to the present invention, the adsorption plate may be adhered to the recess surface of the supporting substrate. Also, since the difference between the depth of the approximate center portion and the depth of the distant portion may be larger than the difference between the thickness of the adsorption plate at the portion contacting the approximate center portion and the thickness of the adsorption plate at the portion contacting the distant portion, the contact surface adhered to the recess surface may have a recess shape even if a predetermined surface process is performed on the contact surface such that the contact surface is curved to a convex shape.

The recess surface of the supporting substrate may include a flat bottom surface portion.

According to the present invention, since the recess surface may have the flat bottom surface portion, the adsorption plate may be stably adhered to the supporting substrate compared to the recess surface having a mortar (bowl) shape.

A lateral cross section of the recess surface of the supporting substrate may have a trapezoidal shape.

According to the present invention, since the lateral cross section of the recess surface may have the trapezoidal shape, it is possible to highly precisely process the depth of the recess surface compared to a case of processing the recess surface to have a spherical shape. Accordingly, the recess shape of the adsorption plate may be highly precisely formed.

The supporting substrate may include a coolant passage formed of an aluminum material and through which a coolant for cooling down the substrate flows, and the adsorption plate may be formed of a ceramic material, wherein a lapping process may be performed on the contact surface, and include a heater for heating the substrate and an electrode for electrostatically holding the substrate inside the ceramic material.

According to the present invention, the substrate may be cooled down by flowing a liquid for cooling through the coolant passage. Also, the substrate may be heated by applying a current to the heater of the adsorption plate. Furthermore, the substrate may be electrostatically adsorbed by applying a direct current to the electrode of the adsorption plate.

According to another aspect of the present invention, there is provided a microwave plasma processing apparatus including the sample table, and configured to generate plasma in a processing chamber by using microwaves and to perform a plasma process on a substrate by using the plasma.

According to the present invention, the substrate held by the sample table may be uniformly plasma-processed.

Advantageous Effects

According to the present invention, even if a predetermined surface process, for example, a lapping process, is performed on a contact surface of an adsorption plate, a substrate can be stably held by forming the contact surface to have an approximate recess shape, thereby uniformly plasma-processing the substrate.

BRIEF DESCRIPTION OF THE DRAWINGS

FIG. 3B is an exploded lateral cross-sectional view schematically showing an example of a sample table;

BEST MODE FOR CARRYING OUT THE INVENTION

Figure 1:
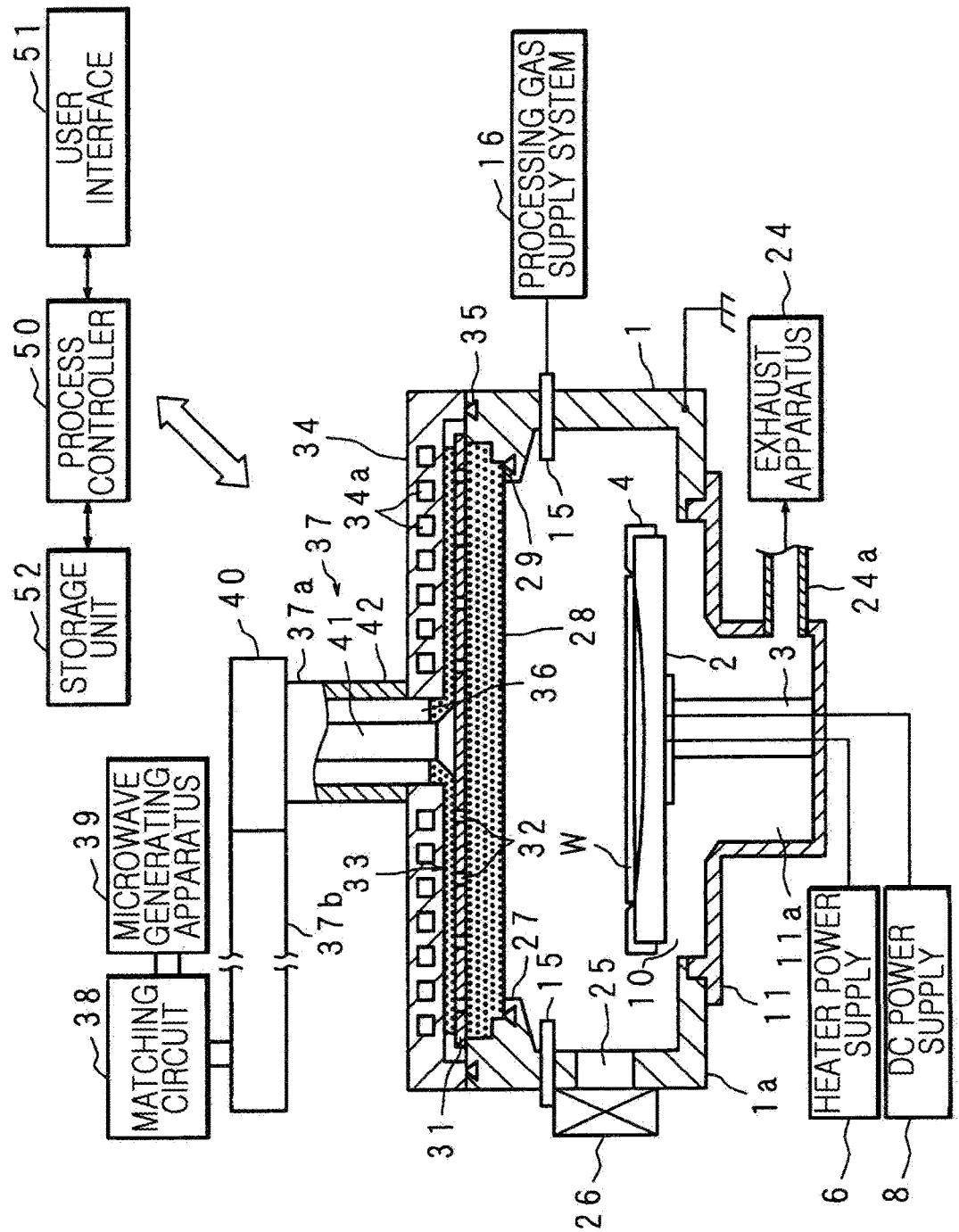
FIG. 1 is a cross-sectional view schematically showing a microwave plasma processing apparatus according to an embodiment of the present invention.

Hereinafter, embodiments of the present invention will be described in detail with reference to accompanying drawings. FIG. 1 is a cross-sectional view schematically showing an example of a microwave plasma processing apparatus according to an embodiment of the present invention. An overall configuration of the microwave plasma processing apparatus will be described, and then details about a sample table 2 will be described.

The microwave plasma processing apparatus according to an embodiment of the present invention includes a processing chamber 1 that is, for example, a radial line slot antenna (RLSA) type, is airtightly configured, is grounded, and has an approximate cylindrical shape. The processing chamber 1 is formed of, for example, aluminum, includes a bottom wall 1a having a circular annular shape with a circular opening portion 10 approximately at a center portion and a side wall provided around the bottom wall 1a, and has an opened top portion. Also, a cylindrical liner formed of quartz may be provided at an inner circumference of the processing chamber 1.

A gas introduction member 15 having an annular shape is provided at the side wall of the processing chamber 1, and a processing gas supply system 16 is connected to the gas introduction member 15. The gas introduction member 15 may be disposed, for example, to have a shower shape. A predetermined processing gas is introduced from the processing gas supply system 16 into the processing chamber 1 through the gas introduction member 15. A processing gas suitable according to a type of a plasma process is used. For example, the sample table 2 is used suitably for a poly silicon (poly-Si) etching process that requires a minute temperature control to perform a highly precise process, and in this case, a hydrogen bromide (HBr) gas, an oxygen ($O_2$) gas, or the like is suitably used. On the other hand, an argon (Ar) gas, a hydrogen ($H_2$) gas, an $O_2$ gas, or the like is used when an oxidation process, such as a selective oxidation process of a tungsten-based gate electrode, is performed.

Also, an inlet/outlet hole 25 for transferring a semiconductor wafer W to and from a transfer chamber (not shown) adjacent to the microwave plasma processing apparatus, and a gate valve 26 for opening and shutting the inlet/outlet hole 25 are provided at the side wall of the processing chamber 1.

An exhaust chamber 11 having a cylindrical shape and a bottom protruding downward is provided at the bottom wall 1a of the processing chamber 1 to communicate with the opening portion 10. An exhaust pipe 24a is provided at a side wall of the exhaust chamber 11, and an exhaust apparatus 24 including a high speed vacuum pump is connected to the exhaust pipe 24a. By operating the exhaust apparatus 24, a gas inside the processing chamber 1 is uniformly discharged into a space 11a of the exhaust chamber 11, and is exhausted through the exhaust pipe 24a. Accordingly, it is possible to quickly depressurize the inside of the processing chamber 1 to a predetermined vacuum level, for example, to 0.133 Pa.

A pillar shape member 3 formed of a ceramic, such as aluminum nitride (AlN), protrudes approximately perpendicularly at a bottom center of the exhaust chamber 11, and the sample table 2 supporting the semiconductor wafer W constituting a substrate to be processed is provided at a front end of the pillar shape member 3. The sample table 2 has a disc shape, and a guide ring 4 for guiding the semiconductor wafer W is provided at an edge portion of the sample table 2. A heater power supply 6 for heating the semiconductor wafer W and a direct current (DC) power supply 8 for electrostatic adsorption are connected to the sample table 2. Also, a wafer supporting pin (not shown) for supporting and elevating the semiconductor wafer W is provided at the sample table 2 such that the wafer supporting pin is capable of protruding from and sinking into a surface of the sample table 2. A detailed configuration of the sample table 2 is described later. Also, a high frequency power supply (not shown) for applying a bias to the semiconductor wafer W may be provided at the sample table 2.

A supporting unit 27 having a ring shape is provided along a peripheral portion of the opening portion formed at the top of the processing chamber 1. A dielectric window 28 formed of a dielectric ceramic, such as quartz or aluminum oxide ($Al_2O_3$), having a disc shape, and through which microwaves may transmit is airtightly provided at the supporting unit 27 through a seal member 29.

A slot plate 31 having a disc shape is provided on the top of the dielectric window 28 to face the sample table 2. The slot plate 31 is engaged to the top end of the side wall of the processing chamber 1 while surface-contacting the dielectric window 28. The slot plate 31 is formed of a conductor, such as a copper or aluminum plate having a gold-plated surface, and includes a plurality of microwave radiating slots 32 penetrating through the slot plate 31 to have a predetermined pattern. In other words, the slot plate 31 constitutes an RLSA antenna. The microwave radiating slots 32 have, for example, long groove shapes, and are disposed such that a pair of adjacent microwave radiating slots 32 forms an approximate L-shape. The plurality of microwave radiating slots 32 that are paired up are arranged in a concentric circular shape. In detail, seven pairs of microwave radiating slots 32 and twenty six pairs of microwave radiating slots 32 are respectively formed on inner and outer circumferences. Lengths or intervals of the microwave radiating slots 32 are determined according to wavelengths, or the like, of microwaves.

A dielectric plate 33 having a dielectric constant higher than vacuum is provided to surface-contact a top surface of the slot plate 31. The dielectric plate 33 has a dielectric disc portion having a plane plate shape. An aperture portion is formed at an approximate center portion of the dielectric disc portion. A microwave incidence portion having a cylindrical shape protrudes from a periphery of the aperture portion, approximately perpendicularly to the dielectric disc portion.

A shield lid 34 having a disc shape is provided at the top surface of the processing chamber 1 to cover the slot plate 31 and the dielectric plate 33. The shield lid 34 is formed of metal, for example, aluminum or stainless steel. A seal member 35 seals a space between the top surface of the processing chamber 1 and the shield lid 34.

A lid-side coolant passage 34a is formed inside the shield lid 34, and the slot plate 31, the dielectric window 28, the dielectric plate 33, and the shield lid 34 are cooled down by flowing a coolant through the lid-side coolant passage 34a. Also, the shield lid 34 is grounded.

An opening portion 36 is formed at a center of a top wall of the shield lid 34, and a waveguide 37 is connected to the opening portion 36. The waveguide 37 includes a coaxial waveguide 37a having a circular cross section extending upward from the opening portion 36 of the shield lid 34, and a rectangular waveguide 37b having a rectangular cross section extending in a horizontal direction and connected to a top end of the coaxial waveguide 37a, wherein a microwave generating apparatus 39 is connected to an end of the rectangular waveguide 37b through a matching circuit 38. Microwaves generated by the microwave generating apparatus 39, for example, microwaves having a frequency of 2.45 GHz, are propagated to the slot plate 31 through the waveguide 37. Alternatively, the frequency of the microwaves may be 8.35 GHz, 1.98 GHz, 915 MHz, or the like. A mode converter 40 is provided at an end of a connecting portion of the rectangular waveguide 37b and the coaxial waveguide 37a. The coaxial waveguide 37a includes a coaxial outer conductor 42 having a container shape, and a coaxial inner conductor 41 disposed along a center line of the coaxial outer conductor 42, wherein a bottom portion of the coaxial inner conductor 41 contacts and is fixed to a center of the slot plate 31. Also, the microwave incidence portion of the dielectric plate 33 is inserted to the coaxial waveguide 37a.

Also, the microwave plasma processing apparatus comprises a process controller 50 for controlling each element of the microwave plasma processing apparatus. A user interface 51 including a keyboard for an operation manager to input a command or the like to manage the microwave plasma processing apparatus, a display for visualizing and displaying an operating state of the microwave plasma processing apparatus, etc. are connected to the process controller 50. A storage unit 52 storing a control program for realizing various processes to be performed in the microwave plasma processing apparatus under the control of the process controller 50, a process control program recorded with process condition data, etc. is connected to the process controller 50. The process controller 50 reads and executes a predetermined process control program from the storage unit 52 according to a direction from the user interface 51, and a predetermined process is performed by the microwave plasma processing apparatus under a control of the process controller 50.

Figure 2:
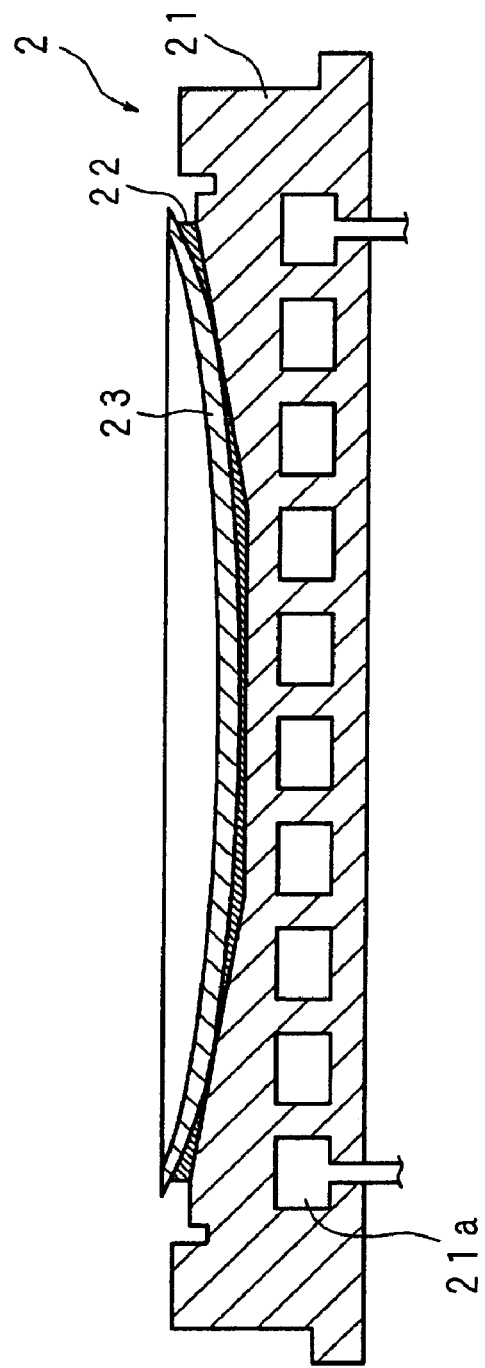
FIG. 2 is a lateral cross-sectional view schematically showing a sample table according to an embodiment of the present invention.
Figure 3A:
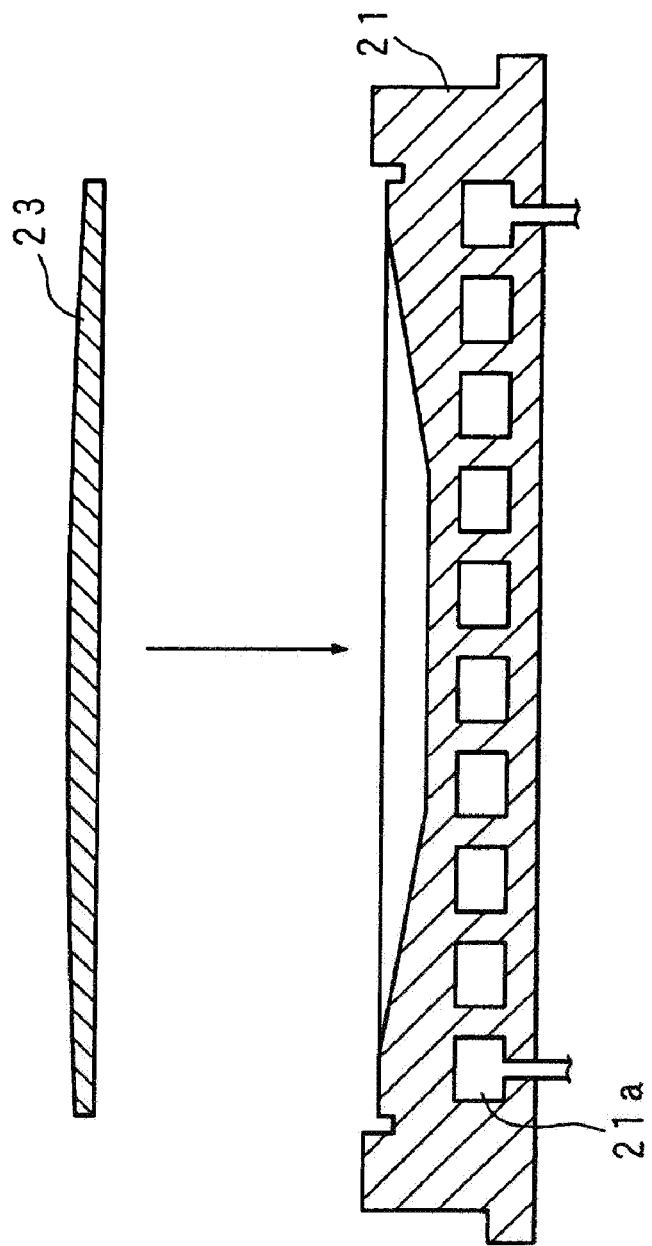
FIG. 3A is an exploded lateral cross-sectional view schematically showing an example of a sample table.

Next, the sample table 2 according to the present embodiment is described in detail. FIG. 2 is a lateral cross-sectional view schematically showing the sample table 2 according to the present embodiment, and FIGS. 3A and 3B are exploded lateral cross-sectional views schematically showing examples of the sample table 2. The sample table 2 includes a supporting substrate 21, and an adsorption plate 23 adhered to the supporting substrate 21 by using an adhesive 22.

Figure 4:
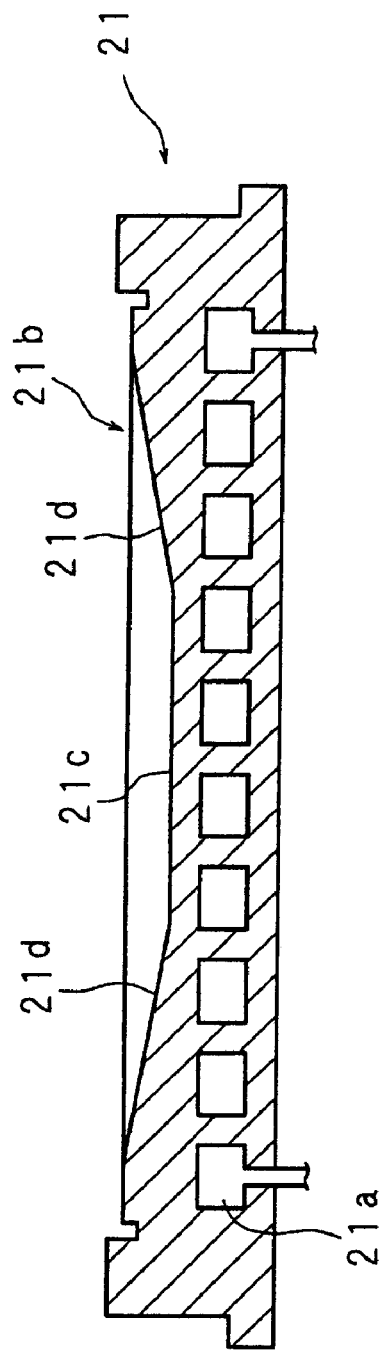
FIG. 4 is a lateral cross-sectional view schematically showing an example of a supporting substrate.

FIG. 4 is a lateral cross-sectional view schematically showing an example of the supporting substrate 21. The supporting substrate 21 has an approximate disc shape having a diameter larger than that of the semiconductor wafer W, is formed of an aluminum material, a stainless material, aluminum-containing silicon carbide, or the like, and includes a coolant passage 21a therein. The coolant passage 21a cools down the semiconductor wafer W by a coolant flowing therethrough. A circular recess surface 21b is formed on one end surface (top surface) of the supporting substrate 21 when viewed from the front, an annular groove portion is formed on an outer diameter direction of the recess surface 21b, and a circular annular outer peripheral portion is additionally formed outside of the annular groove portion. An outer peripheral surface at another end surface of the supporting substrate 21 has a diameter larger than at the one end surface. The recess surface 21b has a flat dish shape having a trapezoidal lateral cross section, and includes a bottom surface portion 21c having a circular shape viewed from a plane and formed at an approximate center portion of the recess surface 21b, and a tapered portion 21d formed such that a depth of the recess surface 21b is decreased from the bottom surface portion 21c in an outer diameter direction. A difference between a depth of a center portion of the recess surface 21b and a depth of the tapered portion 21d spaced apart from the center portion is larger than a difference between a thickness of the adsorption plate 23 at a portion contacting the center portion and a thickness of the adsorption plate 23 at a portion contacting the tapered portion 21d, as described later. In other words, the recess surface 21b has a depth such that, when the adsorption plate 23 is adhered to the recess surface 21b, the adsorption plate 23 has a recess shape.

Figure 5:
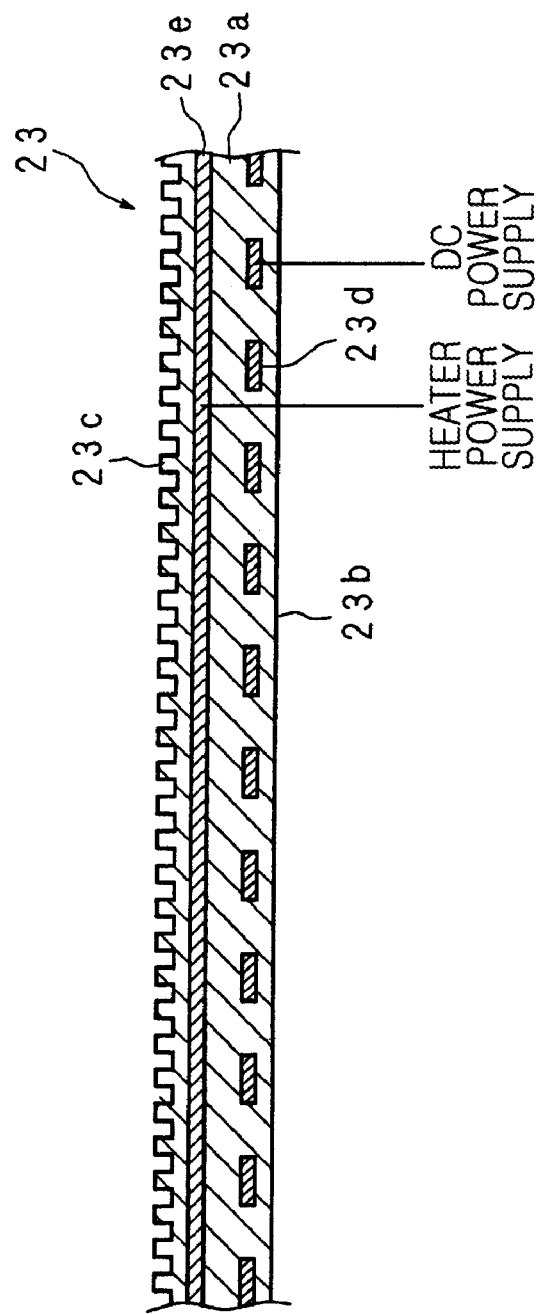
FIG. 5 is a lateral cross-sectional view schematically showing an example of an adsorption plate, wherein main elements of the adsorption plate are magnified.

FIG. 5 is a lateral cross-sectional view schematically showing an example of the adsorption plate 23, wherein main elements of the adsorption plate 23 are magnified. The adsorption plate 23 is formed of a ceramic material and has a disc shape of approximately the same or larger diameter than that of the recess surface 21b of the supporting substrate 21. The adsorption plate 23 has a plate member 23a having a contact surface 23c contacting and adsorbing the semiconductor wafer W, and a noncontact surface 23b constituting a surface opposite to the contact surface 23c. After an embossing process is performed on the contact surface 23c, an embossing vertex portion of the contact surface 23c is smoothened via a lapping process. An approximate center portion of the adsorption plate 23 on which a lapping process has been performed is curved to a convex shape compared to an outer peripheral portion. As shown in FIG. 2, the noncontact surface 23b is adhered to the recess surface 21b of the supporting substrate 21 by using the adhesive 22. Although the recess surface 21b of the supporting substrate 21 has a trapezoidal lateral cross section, the contact surface 23c of the adsorption plate 23 has a smoothly curved recess shape as the adhesive 22 is permeated to a gap between the recess surface 21b and the adsorption plate 23. Also, a heater 23e for heating the semiconductor wafer W and an electrode 23d for electrostatically adsorbing the semiconductor wafer W are buried in the adsorption plate 23, wherein the heater power supply 6 and the DC power supply 8 are respectively connected to the heater 23e and the electrode 23d.

The recess shapes of the recess surface 21b and the adsorption plate 23 shown in FIGS. 2 through 5 are exaggerated, and the contact surface 23c of the adsorption plate 23 adhered to the supporting substrate 21 has an essentially flat recess shape.

Figure 6:
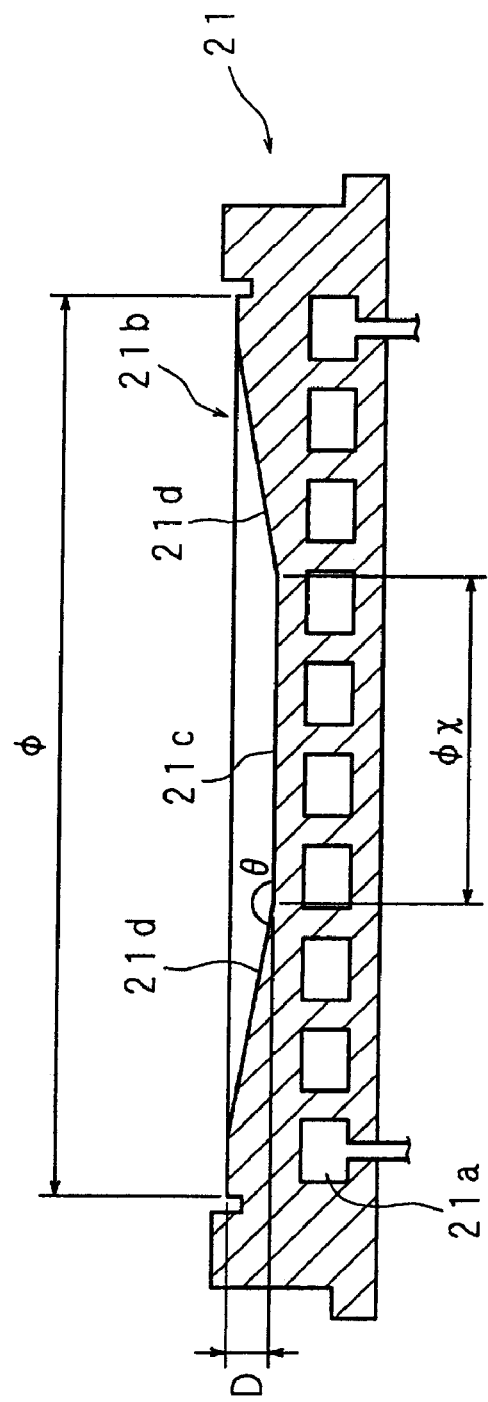
FIG. 6 is a view for describing dimensions of a supporting substrate.

FIG. 6 is a view for describing dimensions of the supporting substrate 21. A diameter $\phi$ of a circular portion where the recess surface 21b is formed at one end surface of the supporting substrate 21 is, for example, 300 mm, a diameter $\phi_X$ of the bottom surface portion 21c of the recess surface 21b is 150 mm, a depth D at the center portion of the recess surface 21b is about 20 to about 25 μm, and an angle θ formed by the bottom surface portion 21c and the tapered portion 21d is from 179.981° to 179.985°. The values of the diameters $\phi$ and $\phi_X$, the depth D, and the angle θ are only examples, and suitable values may be set according to dimensions and thicknesses of the semiconductor wafer W and the adsorption plate 23. However, if the recess surface 21b having the diameter $\phi$ of 300 mm and the depth D of about 20 to about 25 μm is cut-processed, the recess surface 21b may be precisely processed when the diameter $\phi_X$ of the bottom surface portion 21c is set to 150 mm compared to when the diameter $\phi_X$ is set to, for example, 100 mm.

Figure 7:
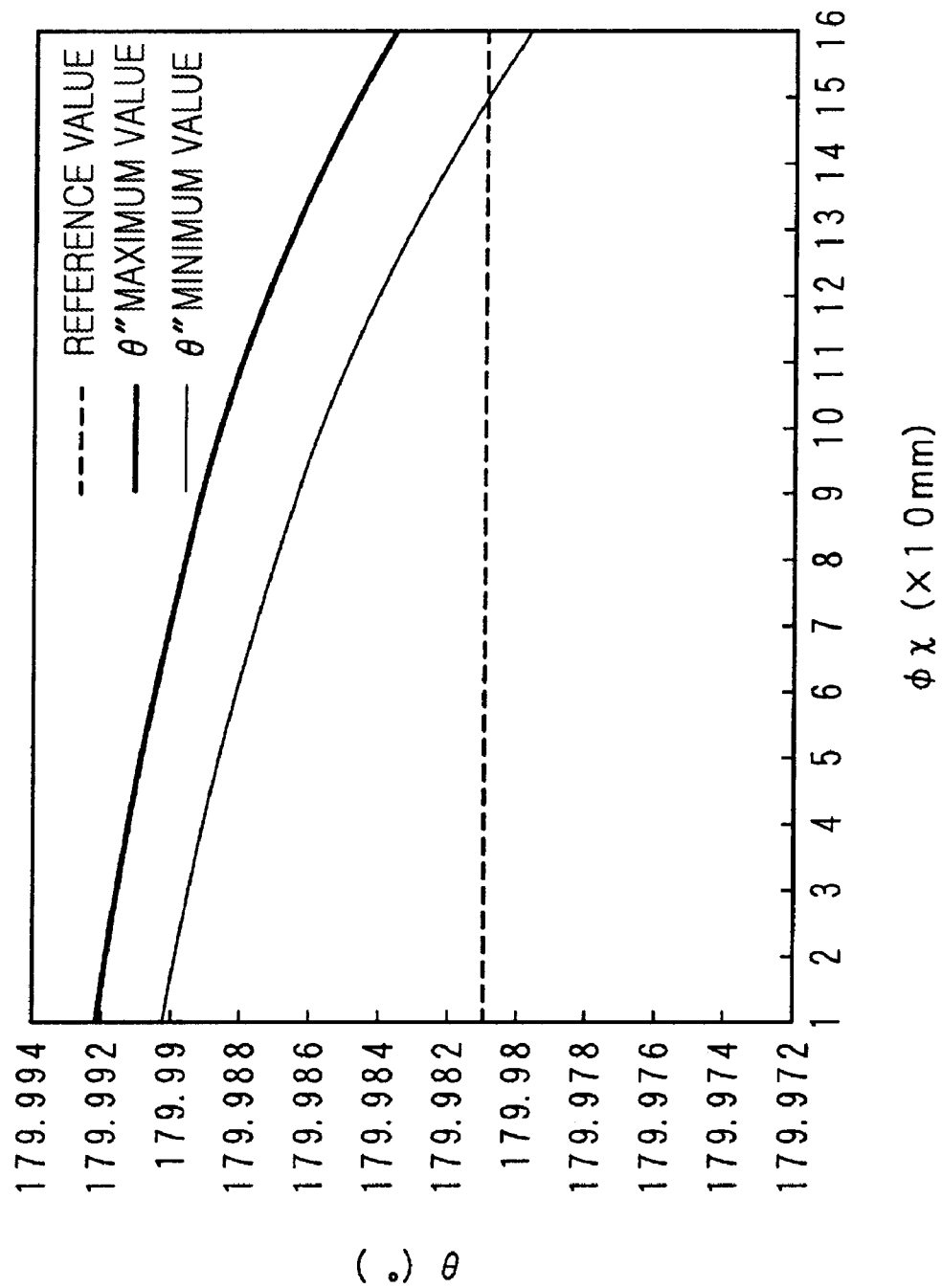
FIG. 7 is a graph for describing a dimension shape of a recess surface formed on a supporting substrate.

FIG. 7 is a graph for describing a dimension shape of the recess surface 21b formed on the supporting substrate 21. A horizontal axis denotes the diameter $\phi_X$ and a vertical axis denotes the angle θ. A graph shown in a thick line shows a maximum value of the angle θ for realizing a recess portion having the diameter $\phi$ of 300 mm and the depth D of about 20 to about 25 μm, and a graph shown in a thin line shows a minimum value of the angle θ. A reference value is a minimum value of the angle θ when the diameter $\phi_X$ is 150 mm.

Figure 8:
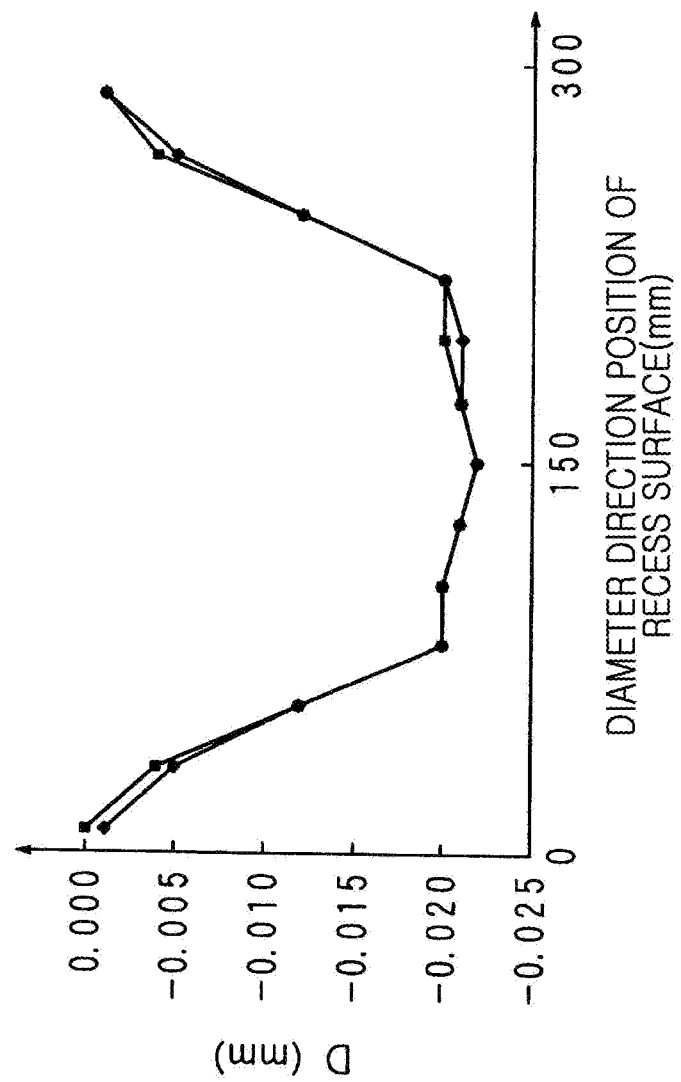
FIG. 8 is a graph showing a depth of a recess surface formed on a supporting substrate.

FIG. 8 is a graph showing a depth of the recess surface 21b formed on the supporting substrate 21. A horizontal axis denotes a diameter direction position of the recess surface 21b, and a vertical axis denotes the depth D. Square-shaped dot plot and rhombus-shaped dot plot show the depths of the recess surfaces 21b separately cut-processed, and thus it is checked that the recess surface 21b is formed with good reproducibility.

Figure 9A:
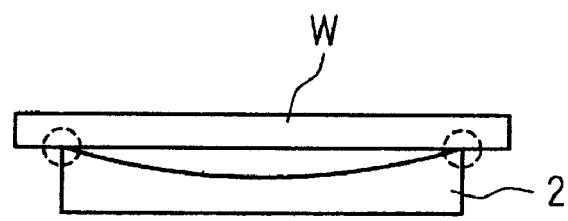
FIG. 9A is a diagram for describing an operation of a sample table according to the present embodiment.
Figure 9B:
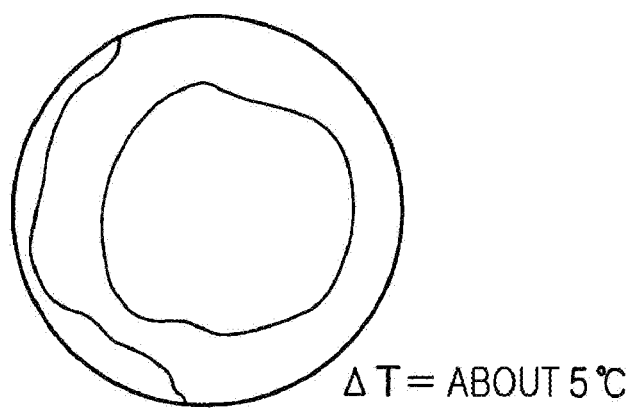
FIG. 9B is a diagram for describing an operation of a sample table 2 according to the present embodiment.
Figure 10A:
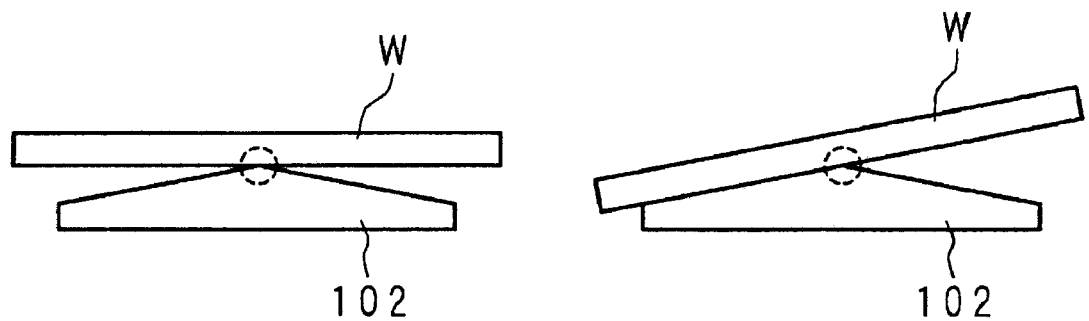
FIG. 10A is a diagram for describing problems of a conventional sample table.
Figure 10B:
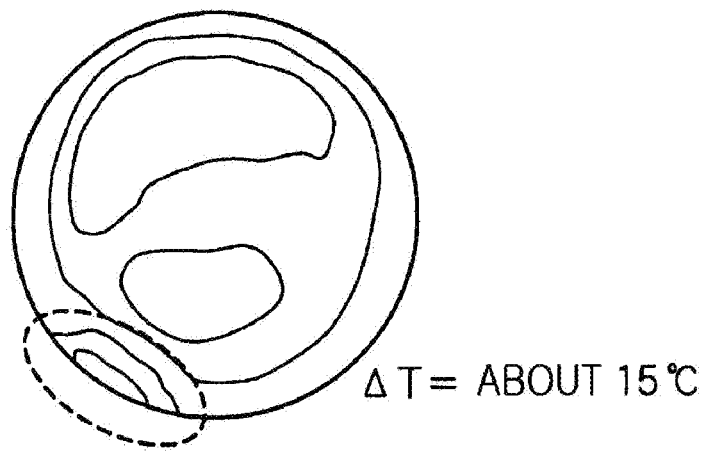
FIG. 10B is a diagram for describing problems of a conventional sample table.

FIGS. 9A and 9B are diagrams for describing operations of the sample table 2 according to the present embodiment. FIG. 9A schematically shows the sample table 2 on which the semiconductor wafer W is held, like FIG. 10A. FIG. 9B shows a measurement result of a temperature distribution in the semiconductor wafer W held on the sample table 2 under a plasma environment. In the present embodiment, even when a lapping process is performed to smooth the contact surface 23c of the adsorption plate 23, the approximate center portion of the contact surface 23c has a flat or curved recess shape as shown in FIG. 9A since the recess surface 21b is formed at the supporting substrate 21 and the adsorption plate 23 is adhered to the recess surface 21b. Also, the recess shape shown in FIG. 9A is exaggerated, and thus is actually an essentially flat recess shape. As such, the semiconductor wafer W horizontally held on the adsorption plate 23 is stably line-supported, and as a result, as shown in FIG. 9B, heat resistance of the semiconductor wafer W is made uniform and the temperature distribution of the semiconductor wafer W is made uniform. When the same experiment with a conventional technology is performed by using the sample table 2 according to the present embodiment, a local temperature difference ΔT at the semiconductor wafer W was suppressed to about 5° C.

According to the microwave plasma processing apparatus and the sample table 2 configured as such, the smoothness of the contact surface 23c is maintained by the lapping process and the contact surface 23c has an approximate recess shape, and thus the semiconductor wafer W may be stably held.

Also, since the recess surface 21b of the supporting substrate 21 has a trapezoidal lateral cross section, the adsorption plate 23 may be stably adhered to the supporting substrate 21 compared to a case when the recess surface 21b has a mortar shape. When the recess surface 21b has a mortar shape, a center portion of the adsorption plate 23 floats, and thus the adsorption plate 23 may be detached. However, when the recess surface 21b has the trapezoidal lateral cross section, detaching of the adsorption plate 23 may be effectively prevented.

Also, since the recess surface 21b of the supporting substrate 21 has the trapezoidal lateral cross section, the depth of the recess surface 21b may be easily and highly precisely processed compared to when the recess surface 21b is processed to have a circular arc shape. As a result, the recess shape of the adsorption plate 23 may be highly precisely formed.

In addition, by flowing a direct current through the electrode 23d buried in the adsorption plate 23, the semiconductor wafer W may surface-contact the contact surface 23c of the adsorption plate 23. While the semiconductor wafer W uniformly surface-contacts the adsorption plate 23, a current may be applied to the heater 23e, thereby heating the semiconductor wafer W, and a coolant may be flowed through the coolant passage 21a of the supporting substrate 21, thereby cooling down the semiconductor wafer W. Accordingly, a temperature of the semiconductor wafer W is uniformly controlled, thereby uniformly plasma-processing the semiconductor wafer W.

The shapes of the recess surface shown in the embodiments are only examples, and are not limited thereto. For example, the recess surface may have a circular arc shape if a precise process is possible. Also, if it is possible to adhere the adsorption plate to the supporting substrate, the recess surface may have a mortar shape.

Also, the semiconductor manufacturing apparatus to which the sample table according to the present embodiment is applied is not specifically limited, and may be any one of various processing apparatuses, such as film-forming processing apparatuses for performing physical vapor deposition (PVD), chemical vapor deposition (CVD), plasma CVD, etc., and etching apparatuses.

While this invention has been particularly shown and described with reference to exemplary embodiments thereof, it will be understood by those skilled in the art that various changes in form and details may be made therein without departing from the spirit and scope of the invention as defined by the appended claims.

The invention claimed is:

1. A manufacturing method of sample table which holds a substrate to be processed, the manufacturing method comprising:
    preparing an adsorption plate which has a first surface contacting the substrate and a planar second surface which is an opposite side of the first surface, and has an electrode therein to electrostatically adsorb the substrate on the first surface;
    preparing a supporting substrate which has a top surface having a first concave recess, wherein the first concave recess includes a circular bottom surface portion and a tapered portion around the circular bottom surface portion, wherein the circular bottom surface portion has a predetermined diameter and the tapered portion forms a predetermined angle with the circular bottom surface portion; and
    applying an adhesive between the first concave recess and the planar second surface, wherein the planar second surface is adhered to the circular bottom surface portion and the tapered portion to approximately conform to the first concave recess such that the first surface of the adhered adsorption plate forms a second concave recess.

2. The manufacturing method of sample table of claim 1, wherein the circular bottom surface portion of the first concave recess of the supporting substrate comprises a flat bottom surface portion.

3. The manufacturing method of sample table of claim 1, wherein a lateral cross section of the first concave recess of the supporting substrate has a trapezoidal shape.

4. The manufacturing method of sample table of claim 1, wherein the adsorption plate is formed of a ceramic material,
    the preparing of the adsorption plate comprises performing a lapping process on the first surface, and forming, inside the ceramic material, a heater for heating the substrate, and
    the preparing of the supporting substrate comprises preparing a coolant passage formed of an aluminum material and through which a coolant for cooling down the substrate flows.

5. The manufacturing method of sample table of claim 3, wherein the applying of the adhesive comprises permeating the adhesive between the first concave recess of the supporting substrate and the second surface of the adsorption plate.

6. The manufacturing method of sample table of claim 1, wherein a difference between a depth of an approximate center portion of the first concave recess and a depth of a distant portion spaced apart from the approximate center portion is larger than a difference between a thickness of the adsorption plate at a portion contacting the approximate center portion and a thickness of the adsorption plate at a portion contacting the distant portion.

7. The manufacturing method of sample table of claim 6, wherein the first concave recess of the supporting substrate has a circular shape, and
    the thickness of the adsorption plate at the portion contacting the approximate center portion is larger than the thickness of the adsorption plate at the portion contacting the distant portion.

8. The manufacturing method of sample table of claim 6, wherein a depth of an approximate center portion of the first concave recess is set to be in a range of $6.66 \times 10^{-5}$ times to $8.33 \times 10^{-5}$ times of a diameter of the first concave recess.

9. A manufacturing method of microwave plasma processing apparatus comprising a sample table which holds a substrate to be processed, and configured to generate plasma in a processing chamber by using microwaves and to perform a plasma process on the substrate by using the plasma, wherein the manufacturing method comprising:
    preparing an adsorption plate which has a first surface contacting the substrate and a planar second surface which is an opposite side of the first surface, and has an electrode therein to electrostatically adsorb the substrate on the first surface;
    preparing a supporting substrate which has a top surface having a first concave recess, wherein the first concave recess includes a circular bottom surface portion and a tapered portion around the circular bottom surface portion, wherein the circular bottom surface portion has a predetermined diameter and the tapered portion forms a predetermined angle with the circular bottom surface portion; and
    applying an adhesive between the first concave recess and the planar second surface, wherein the planar second surface is adhered to the circular bottom surface portion and the tapered portion to approximately conform to the first concave recess such that the first surface of the adhered adsorption plate forms a second concave recess.

* * * * *